(12) United States Patent
Perner et al.

(10) Patent No.: US 6,185,143 B1
(45) Date of Patent: Feb. 6, 2001

(54) MAGNETIC RANDOM ACCESS MEMORY (MRAM) DEVICE INCLUDING DIFFERENTIAL SENSE AMPLIFIERS

(75) Inventors: Frederick A Perner, Palo Alto, CA (US); Kenneth I Eldredge, Boise, ID (US); Lung T Tran, Saratoga, CA (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/498,587

(22) Filed: Feb. 4, 2000

(51) Int. Cl.[7] .............................. G11C 11/15; G11C 11/16
(52) U.S. Cl. ...................... 365/210; 365/207; 365/209; 365/205; 365/202; 365/171; 365/173
(58) Field of Search ........................................ 365/157, 158, 365/130, 145, 171, 173, 205, 207, 209, 210, 202

(56) References Cited

U.S. PATENT DOCUMENTS

| | | | |
|---|---|---|---|
| 4,633,443 | * 12/1986 | Childers | 365/203 |
| 5,831,920 | * 11/1998 | Chen et al. | 365/225.5 |
| 5,898,612 | * 4/1999 | Chen et al. | 365/158 |
| 5,982,658 | * 11/1999 | Berg et al. | 365/158 |

\* cited by examiner

Primary Examiner—Andrew Q. Tran
(74) Attorney, Agent, or Firm—Tho

(57) ABSTRACT

Resistance of a selected memory cell in a Magnetic Random Access Memory ("MRAM") device is sensed by a read circuit including a differential amplifier, a first current mode preamplifier coupled to a sense node of the differential amplifier, and a second current mode preamplifier coupled to a reference node of the differential amplifier. During a read operation, the first preamplifier applies a regulated voltage to the selected memory cell, and the second preamplifier applies a regulated voltage to a reference cell. A sense current flows through the selected memory cell and to the sense node of the differential amplifier, while a reference current flows through the reference cell and to the reference node of the differential amplifier. Resulting is a differential voltage across sense and reference nodes. The differential voltage indicates whether a logic value of '0' or '1' is stored in the selected memory cell.

20 Claims, 7 Drawing Sheets

MAGNETIC RANDOM ACCESS MEMORY (MRAM) DEVICE INCLUDING DIFFERENTIAL SENSE AMPLIFIERS

BACKGROUND OF THE INVENTION

The present invention relates to random access memory for data storage. More specifically, the present invention relates to a magnetic random access memory device including an array of memory cells and sense amplifiers for sensing resistance of the memory cells.

Magnetic Random Access Memory ("MRAM") is a non-volatile memory that is being considered for long term data storage. Performing read and write operations in MRAM devices would be orders of magnitude faster than performing read and write operations in conventional long term storage devices such as hard drives. In addition, the MRAM devices would be more compact and would consume less power than hard drives and other conventional long term storage devices.

A typical MRAM device includes an array of memory cells. Word lines extend along rows of the memory cells, and bit lines extend along columns of the memory cells. Each memory cell is located at a cross point of a word line and a bit line.

A memory cell stores a bit of information as an orientation of a magnetization. The magnetization of each memory cell assumes one of two stable orientations at any given time. These two stable orientations, parallel and anti-parallel, represent logic values of "0" and "1."

The magnetization orientation affects the resistance of a memory cell such as a spin-tunneling device. For instance, resistance of a memory cell is a first value R if the magnetization orientation is parallel, and the resistance of the memory cell is increased to a second value R+ΔR if the magnetization orientation is changed from parallel to anti-parallel. The magnetization orientation of a selected memory cell and, therefore, the logic state of the memory cell may be read by sensing the resistance state of the memory cell.

The resistance state may be sensed by applying a voltage to a selected memory cell and measuring a sense current that flows through the memory cell. Ideally, the resistance would be proportional to the sense current.

However, sensing the resistance state of a single memory cell in the array can be unreliable. All memory cells in the array are coupled together through many parallel paths. The resistance seen at one cross point equals the resistance of the memory cell at that cross point in parallel with resistances of memory cells in the other rows and columns (the array of memory cells may be characterized as a cross point resistor network).

Moreover, if the memory cell being sensed has a different resistance due to the stored magnetization, a small differential voltage may develop. This small differential voltage can give rise to a parasitic or "sneak path" current. The parasitic current is typically much larger than the sense current and, therefore, can obscure the sense current. Consequently, the parasitic current can prevent the resistance from being sensed.

Unreliability in sensing the resistance is compounded by manufacturing variations, variations in operating temperatures, and aging of the MRAM devices. These factors can cause the average value of resistance in the memory cell array to vary by a factor of two or three.

There is a need to reliably sense the resistance states of memory cells in MRAM devices.

SUMMARY OF THE INVENTION

These needs are met by the present invention. According to one aspect of the present invention, apparatus for sensing a resistance state of a selected memory cell in an MRAM device includes a differential amplifier having sense and reference nodes; a first current mode preamplifier coupled between the selected memory cell and the sense node of the differential amplifier; a reference cell; and a second current mode preamplifier coupled between the reference cell and the reference node of the differential amplifier.

Other aspects and advantages of the present invention will become apparent from the following detailed description, taken in conjunction with the accompanying drawings, illustrating by way of example the principles of the invention.

DETAILED DESCRIPTION OF THE INVENTION

Figure 1:
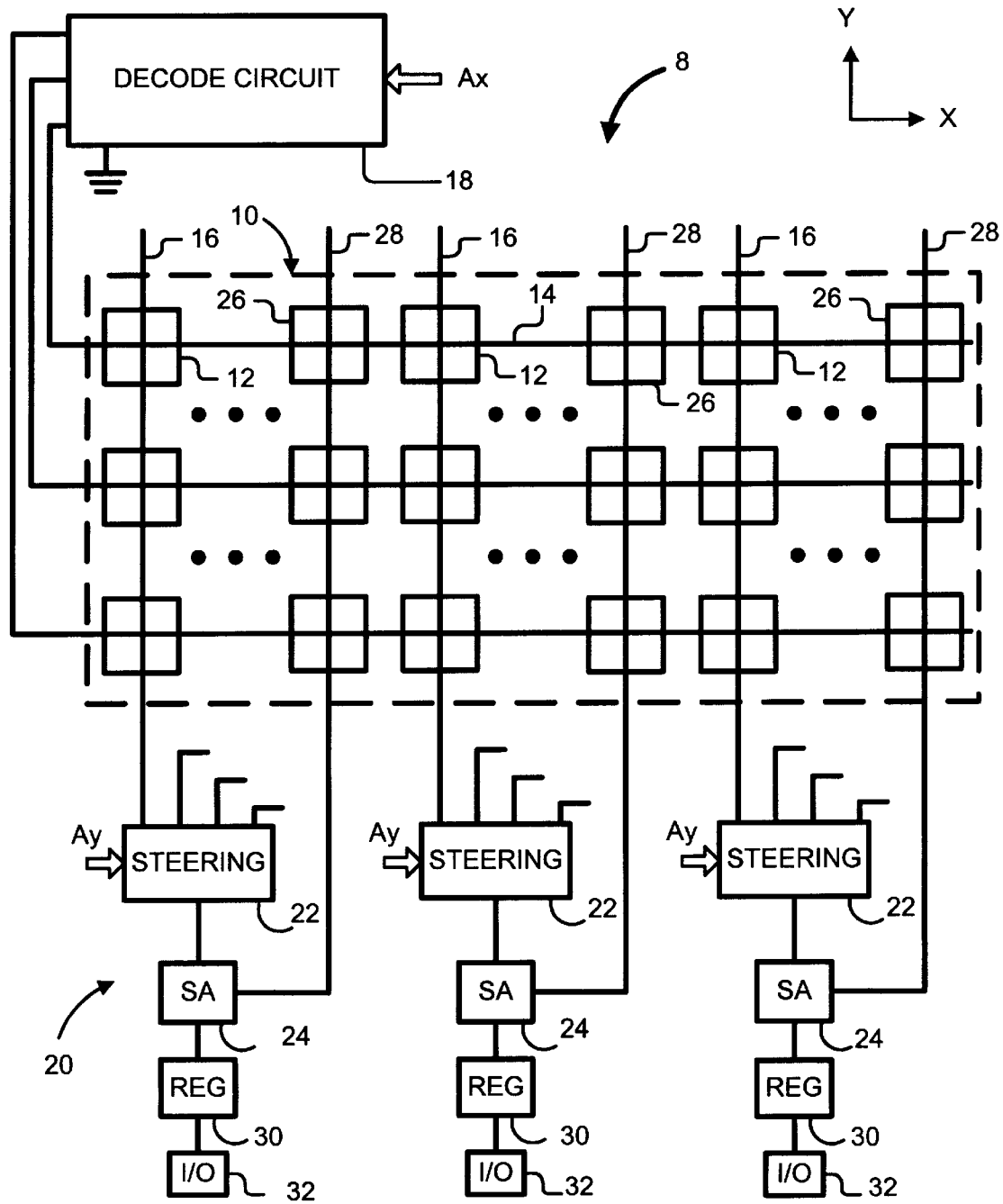
FIG. 1 is an illustration of an MRAM device according to the present invention.

As shown in the drawings for purposes of illustration, the present invention is embodied in an MRAM device. The MRAM device includes an array of memory cells and a read circuit for reading data from the memory cells. The read circuit includes differential sense amplifiers, which can reliably sense different resistance states of selected memory cells in the array.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, arrays of 1024× 1024 memory cells or larger may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10. Each memory cell 12 is located at a cross point of a corresponding word line 14 and bit line 16.

Figure 2A:
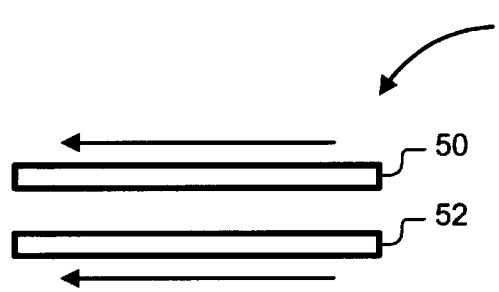
FIGS. 2a and 2b are illustrations of parallel and anti-parallel magnetization orientations of a memory cell.
Figure 2B:
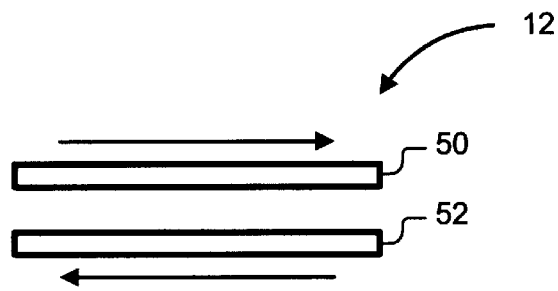

The memory cells 12 are not limited to any particular type of device. For example the memory cells 12 may be spin dependent tunneling ("SDT") devices. A typical SDT device includes a "pinned" layer and a "free" layer. The pinned layer has a magnetization that is oriented in a plane, but fixed so as not to rotate in the presence of an applied magnetic field in a range of interest. The free layer has a magnetization orientation that is not pinned. Rather, the magnetization can be oriented in either of two directions along an axis (the "easy" axis) lying in a plane. If the magnetization of the free and pinned layers 50 and 52 are in the same direction, the orientation is said to be "parallel" (as indicated by the arrows in FIG. 2a). If the magnetization of the free and pinned 50 and 52 layers are in opposite directions, the orientation is said to be "anti-parallel" (as indicated by the arrows in FIG. 2b).

The free layer and the pinned layer are separated by an insulating tunnel barrier. The insulating tunnel barrier allows quantum mechanical tunneling to occur between the free and pinned layers. This tunneling phenomenon is electron spin dependent, making the resistance of the SDT device a function of the relative orientations of the magnetization of the free and pinned layers.

For instance, resistance of a memory cell 12 is a first value R if the orientation of magnetization of the free and pinned layers is parallel. Resistance of the memory cell 12 is increased to a second value R+$\Delta$R if the magnetization orientation is changed from parallel to anti-parallel. A typical resistance R may be about one megaohm. A typical change in resistance $\Delta$R may about 10% of the resistance R.

Data is stored in a memory cell 12 by orienting the magnetization along the easy axis of the free layer. A logic value of "0" may be stored in the memory cell 12 by orienting the magnetization of the free layer such that the magnetization orientation is parallel, and a logic value of "1" may be stored in the memory cell 12 by orienting the magnetization of the free layer such that the magnetization orientation is anti-parallel.

Each memory cell 12 retains its orientation of magnetization, even in the absence of external power. Therefore, the memory cells 12 are nonvolatile.

The MRAM device 8 also includes a row decoder 18 for selecting word lines 14 during read and write operations. A word line 14 may be selected during a read operation by connecting that word line 14 to ground.

The MRAM device 8 also includes a read circuit for sensing the resistance of selected memory cells 12 during read operations and a write circuit for orienting the magnetization of the selected memory cells 12 during write operations. The read circuit is indicated generally at 20. The write circuit is not shown in order to simplify the explanation of the present invention.

The read circuit 20 includes a plurality of steering circuits 22 and sense amplifiers 24. Multiple bit lines 16 are connected to each steering circuit 22. Each steering circuit 22 includes a set of switches that connect each bit line 16 to either a constant voltage source or to a sense amplifier 24. Each steering circuit 22 further includes a column decoder. The column decoder selects only one switch for connecting the selected bit line 16 to the sense amplifier 24. All other (unselected) bit lines 16 are connected to the constant voltage source. The constant voltage source may be supplied from an external circuit. The sense amplifier 24 applies the same potential to a selected bit line 16 as the constant voltage source applies to the unselected bit lines 16. Applying equal potentials to the selected and unselected bit lines 16 reduces parasitic currents.

The MRAM device 8 includes a column of reference cells 26 for each sense amplifier 24 and bit line 28 for each reference cell column. Each bit line 28 crossing a reference cell column is connected to a corresponding sense amplifier 24. Thus, an MRAM device 8 having sixteen sense amplifiers 24 would have sixteen columns of reference cells 26.

During a read operation, a memory cell 12 is selected by supplying a row address Ax to the row decoder 18 and a column address Ay to the steering circuits 22. In response to the row address Ax, the row decoder 18 couples a word line 14 to ground. In response to the column address Ay, a steering circuit 22 couples a bit line 16 to a sense amplifier 24. A selected memory cell 12 lies at the intersection of a selected word line 14 and a selected bit line 16. A reference cell 26 is also selected when a word line 14 crossing that reference cell 26 is selected.

The sense amplifier 24 applies equal potentials to the selected and reference bit lines 16 and 28, causing sense and reference currents to flow through the selected memory and reference memory cells 12 and 26. The sense amplifier 24 includes a differential amplifier for comparing the sense and reference currents to determine the resistance state of the selected memory cell 12 and, therefore, the logic value stored in the selected memory cell 12. An output of the sense amplifier 24 is supplied to an output register 30, which, in turn, is coupled to an I/O pad 32 of the MRAM device 8.

The read circuit 20 may read out data in m-bit words, whereby the resistance states of a number m of memory cells 12 are sensed simultaneously. For example, a first group of k contiguous bit lines 16 might be multiplexed into a first sense amplifier 24, a second group of k contiguous bit lines 16 might be multiplexed into a second sense amplifier 24, and so on. An m-bit word might be read out by operating m consecutive sense amplifiers 24 simultaneously.

If a single sense amplifier 24 can fit a pitch of four columns, 256 sense amplifiers 24 may be used for a 1024× 1024 array 10 of memory cells 12. A total of k=4 bit lines 16 may be multiplexed into each sense amplifier 24. If the MRAM device 8 has multiple levels of memory cell arrays (see, for example, FIG. 9), bit lines 16 from the additional levels may be multiplexed into the sense amplifiers 24.

Figure 3:
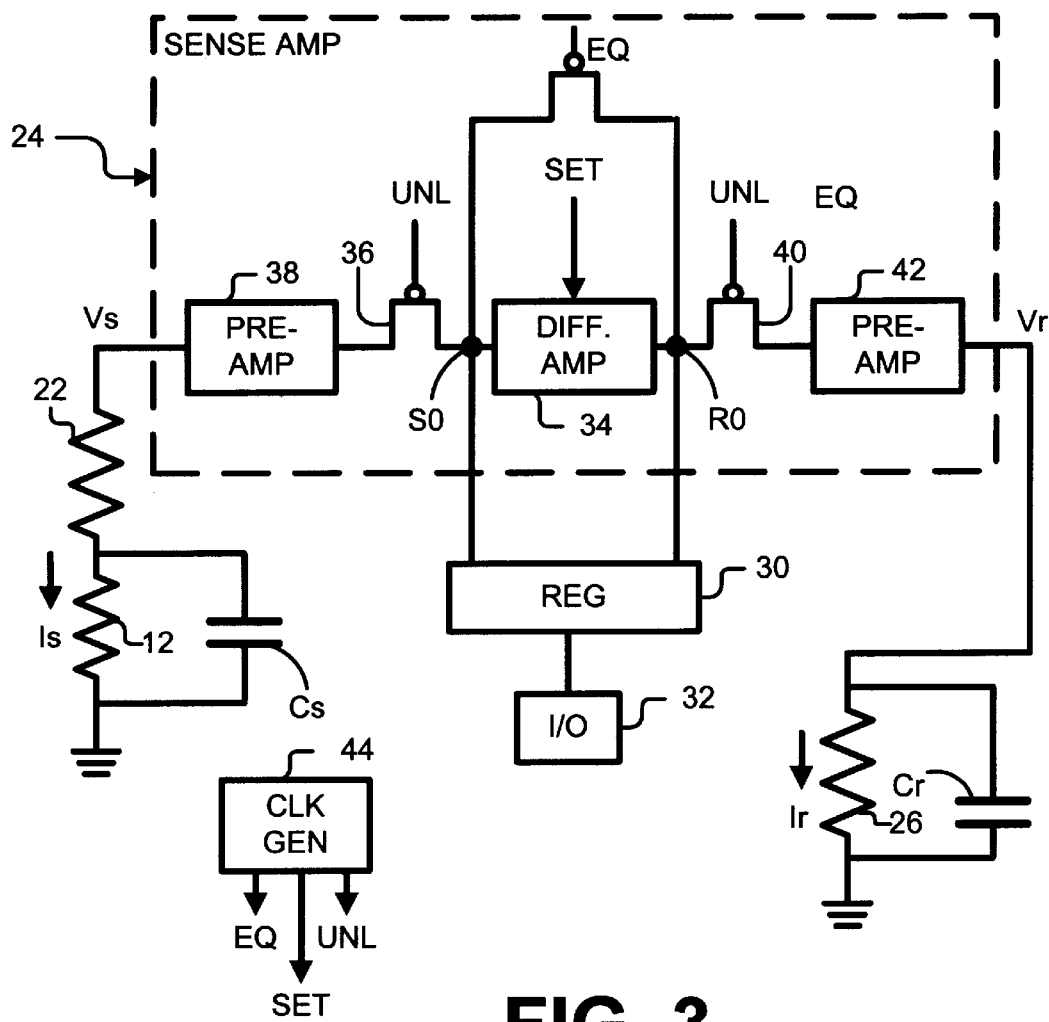
FIG. 3 is an illustration of a differential sense amplifier, which forms a part of a read circuit for the MRAM device.

Reference is now made to FIG. 3, which shows a sense amplifier 24 coupled to selected memory and reference cells 12 and 26. The selected memory cell 12 is represented by a resistor, the selected reference cell 26 is represented by a resistor, and the steering circuit 22 is represented by a resistor. A first capacitor Cs represents all parasitic capacitance associated with the selected memory cell 12, and a second capacitor Cr represents all parasitic capacitance associated with the selected reference cell 26.

The sense amplifier 24 includes a differential amplifier 34 having a sense node S0 and a reference node R0. A first switch 36 is coupled between a first current mode preamplifier 38 and the sense node S0. The first current mode preamplifier 38 is also coupled to the selected memory cell 12. A second switch 40 is coupled between a second current mode preamplifier 42 and the reference node R0. The second current mode preamplifier 42 is also coupled to the reference cell 26.

A clock generator 44 generates an Equalization signal EQ, an Unload signal UNL and a Set signal SET. Asserting the Unload signal UNL causes both the first and second switches 36 and 40 to turn on (that is, become conductive) and de-asserting the Unload signal UNL causes both the first and second switches 36 and 40 to turn off. Asserting the Set signal SET causes a differential voltage across the sense and reference nodes S0 and R0 to be amplified. Asserting the Equalization signal EQ causes the sense and reference node voltages to be equalized. If asserted at the same time as the Unload signal UNL, the Equalization signal EQ further causes sense and reference currents Is and Ir to flow through the selected memory and reference cells 12 and 26. The clock generator 44 may be local (that is, one clock generator 44 may be provided for each sense amplifier 26) or global (that is, a single clock generator 44 may provide signals EQ, UNL and SET to all of the sense amplifiers 24).

Figure 4:
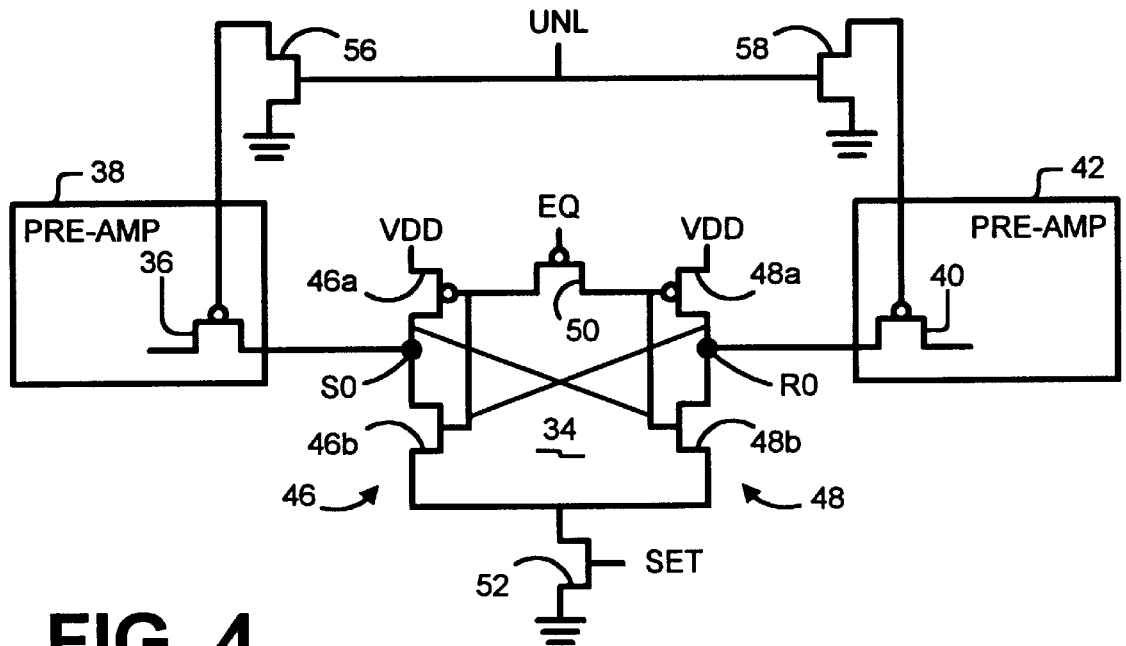
FIG. 4 is a more detailed illustration of the differential sense amplifier

Reference is now made to FIG. 4, which shows the differential amplifier 34 in greater detail. The differential amplifier 34 includes a pair of cross-coupled CMOS inverters 46 and 48. A first inverter 46 of the pair is formed by first and second FETS 46a and 46b. A second inverter 48 of the pair is formed by third and fourth FETs 48a and 48b. The sense node S0 is between drain-source paths of the first and second FETs 46a and 46b, and the reference node R0 is between drain-source paths of the third and fourth FETs 48a and 48b. Such a differential amplifier 34 is a regenerative amplifier that has two stable states.

A fifth FET 50, having a drain-source path coupled between gates of the first and third FETs 46a and 48a, is turned on and off by the Equalization signal EQ. A sixth FET 52, having a drain-source path coupled between the cross-latched inverters 46 and 48 and ground, is turned on and off by the Set signal SET.

The current mode preamplifiers 38 and 42, which may be current mirror or direct injection charge amplifiers, regulate the voltage across the selected memory cell 12 and the selected reference cell 26. One such direct injection charge amplifier is disclosed in U.S. Ser. No. 09/430,238 filed Oct. 29, 1999, which is incorporated herein by reference.

If the current mode preamplifiers 38 and 42 are direct injection charge preamplifiers, each preamplifier 38 and 42 includes a current source transistor 36 and 40. The current source transistor 36 of the first current mode preamplifier 38 may also function as the first switch 36, and the current source transistor 40 of the second current mode preamplifier 42 may also function as the second switch 40. The Unload signal UNL turns on and off the current source transistors 36 and 40 via unload logic 56 and 58.

Figure 5:
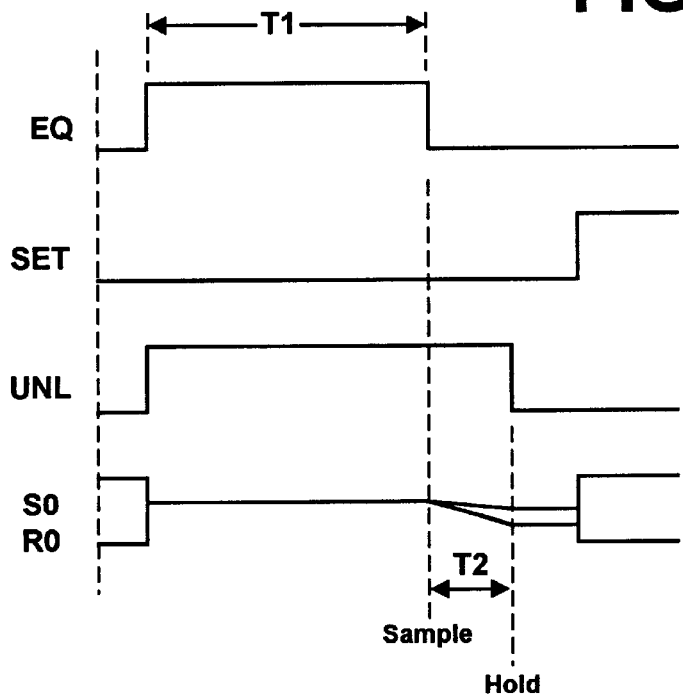
FIG. 5 is a timing diagram of signals used for controlling the differential sense amplifier.
Figure 6:
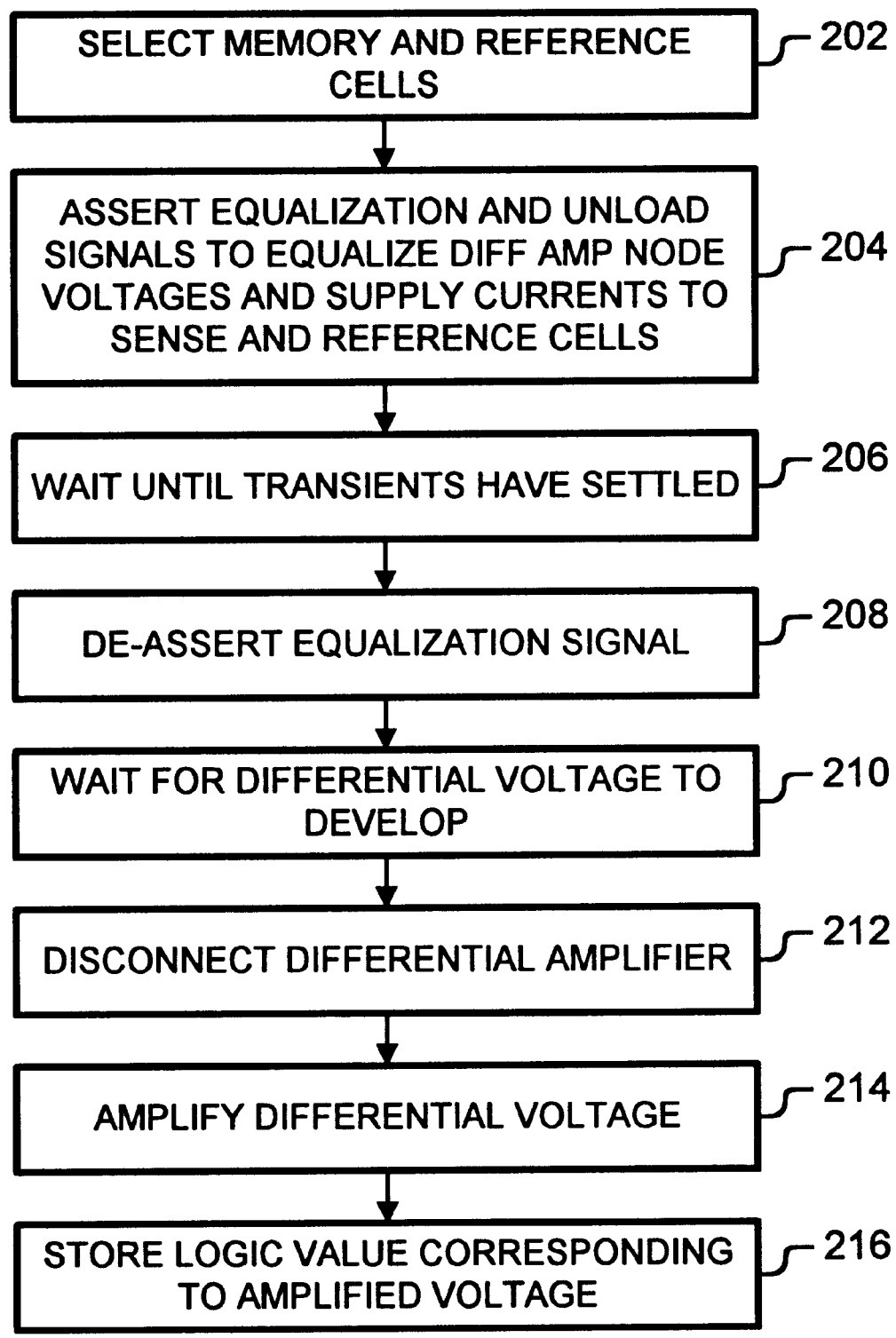
FIG. 6 is a flowchart of a method of sensing a resistance state of a memory cell.

Reference is now made to FIGS. 5 and 6, which illustrate a method of using the sense amplifier 24 to read a memory cell 12. The memory cell 12 is selected by selecting a word line 14 and a bit line 16 (block 202). Selecting the word line 14 also selects a reference cell 26 in the reference cell column. Transients are usually created when the word line 14 goes from an unselected-to-selected state and a previously selected word line 14 goes from a selected-to-unselected state. Transients are also usually created when the bit line 16 goes from an unselected-to-selected state and a previously selected bit line 16 goes from a selected-to-unselected state. Switching between read and write modes can also cause transients.

After the memory cell 12 has been selected, the clock generator 44 asserts the Unload and Equalization signals UNL and EQ (block 204). Asserting the Unload signal UNL causes the first and second switches 36 and 40 to couple the differential amplifier 34 to the first and second current mode preamplifiers 38 and 42. Asserting the Equalization signal EQ causes voltages at the sense and reference nodes S0 and R0 of the differential amplifier 34 to be equalized. Consequently, there is no differential voltage across the sense and reference nodes S0 and R0, and effects caused by circuit imbalances in the differential amplifier 34 are eliminated.

Asserting the Unload and Equalization signals UNL and EQ at the same time also causes the differential amplifier 34 to supply a sense current Is to the selected memory cell 12 and a reference current Ir to the selected reference cell 26. The first and third FETs 46a and 48a of the differential amplifier 34 connect the first and second current mode preamplifiers 38 and 42 to the voltage source. The sense and reference nodes S0 and R0 are pulled towards the source voltage VDD, and currents Is and Ir flow from the voltage source to both nodes S0 and R0 of the differential amplifier 34 and on to the selected memory and reference cells 12 and 26, respectively. The first current mode preamplifier 38 regulates the array voltage Vs across the selected memory cell 12. Similarly, the second current mode preamplifier 42 regulates the reference voltage Vr across the selected reference cell 26. Ideally, the array and reference voltages Vs and Vr are equal.

Equalization is performed until the transients have settled or decayed to an acceptable level (block 206). Decay time of the transients is a function of the size of the array and the properties of the memory cells. The decay time may be estimated or determined empirically.

Equalization is ended by de-asserting the Equalization signal EQ. When the Equalization signal EQ is de-asserted, the sense and reference nodes S0 and R0 are no longer held to the source voltage VDD (block 208). Instead, the node voltages are allowed to float. The heavier of the two currents Is and Ir will cause its node voltage to sag faster. Consequently, a voltage differential begins to develop across the sense and reference nodes S0 and R0. Thus begins a sample period.

The differential voltage is allowed to develop for a second time period T2 (block 210). This second time period T2 is determined empirically and through knowledge of the technology. The second time period may be based on the sense and reference currents and the capacitances at the sense and reference nodes S0 and R0.

After the second time period T2 has elapsed, the differential voltage is held in the differential amplifier 34. The differential voltage may be held by deasserting the Unload signal UNL, which causes the first and second switches 36 and 40 to turn off and thereby disconnect the differential amplifier 34 from the preamplifiers 38 and 42 (block 212).

The differential voltage is then amplified by asserting the Set signal SET (block 214). Asserting the Set signal SET causes the sixth FET 52 to be turned on. Consequently, the differential amplifier side associated with a '1' is pulled down to a full swing logic voltage and the differential amplifier side associated with a '0' is pulled up to a full swing logic voltage.

The amplified differential voltage is applied to the register 30, which, depending upon the voltage level, stores either a logic '0' or a logic '1' (block 216). The logic value stored in the register 30 is then sent to the associated I/O pad 32 of the MRAM device 8.

Thus disclosed is an MRAM device including a sense amplifier that can read data reliably. Parasitic currents are reduced and do not obscure the sense current during a read operation. In addition, sensitivity of the MRAM device to aging and manufacturing and operating temperature variations is reduced.

The invention is not limited to the specific embodiments described and illustrated above. For instance, the invention is not limited to the use of spin dependent tunneling devices. Other types of devices that could be used include, but are not limited to, giant magnetoresistance ("GMR") devices.

The invention has been described in connection with the rows being oriented along the easy axis. However, the rows and columns could be transposed.

The differential amplifier described above includes a pair of cross-coupled inverters. However, the differential amplifier is not so limited. For example, the differential amplifier may be an analog differential amplifier.

According to the timing diagram of FIG. 5, a signal is asserted by making it go high and de-asserted by making it go low. However, a signal could be asserted by making it go low and de-asserted by making it go high. The actual timing will be based on a specific technology.

Figure 7:
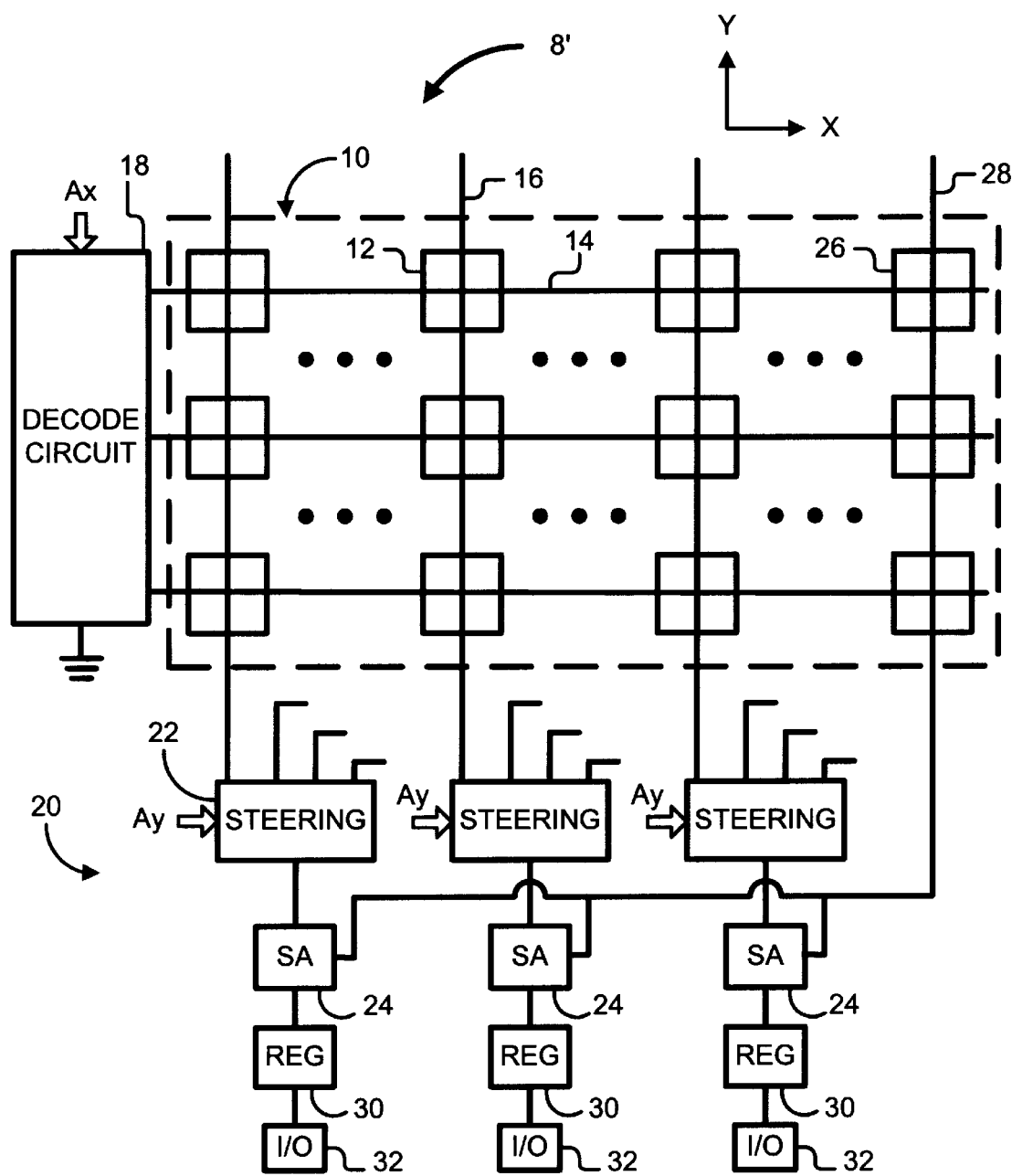
FIG. 7 is an illustration of another MRAM device according to the present invention.

Although FIG. 1 shows an MRAM device that includes a column of reference cells for each sense amplifier, the invention is not so limited. Any number of columns may be used. See, for example, an MRAM device 8' shown in FIG. 7. All but the last column of memory cells 12 has a bit line 16 connected to a steering circuit 22. The last column is used as reference cells 26, and the bit line 28 crossing the last column is connected to each sense amplifier 24. The current mode preamplifiers of the MRAM device 8' may be current-mirror charge amplifiers or direct-injection charge amplifiers. If direct-injection charge amplifiers are used, however, the clock generator(s) generates a signal for enabling only one sense amplifier to apply a regulated voltage to the single column of reference cells 26.

Figure 8:
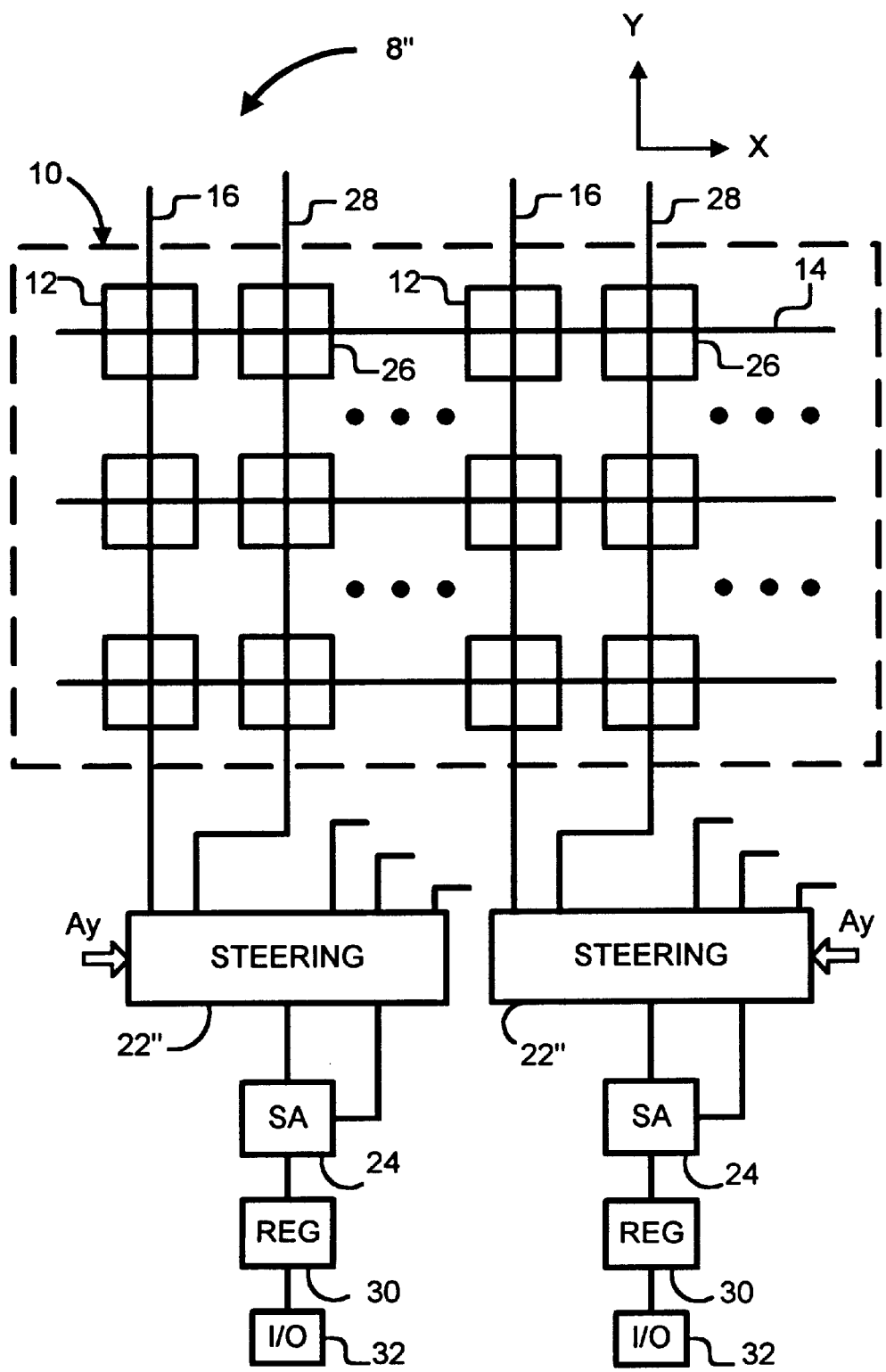
FIG. 8 is an illustration of yet another MRAM device according to the present invention.

In the alternative, an MRAM device 8" may include one column of reference cells 26 for each column of memory cells 12. Resulting is a bit-bitbar arrangement as shown in FIG. 8. Each reference cell 26 stores the complement of the logic value stored in a corresponding memory cell 12. Thus, if a memory cell 12 stores a logic '1', the corresponding reference cell 26 stores a logic '0'. A steering circuit 22" multiplexes the bit lines 16 crossing the memory cells 12 to either the first current mode preamplifier or the voltage source. The steering circuit 22" also multiplexes the bit lines 28 crossing the reference cells 26 to either the second current mode preamplifier or the voltage source. When a memory cell 12 is selected, the bit line 16 crossing the selected memory cell 12 is connected to the first current mode preamplifier 38, and the bit line 28 crossing its corresponding reference cell 26 is connected to the second current mode preamplifier 42. The sense node S0 will be pulled to a logic '1' and the reference node R0 will be pulled to a logic '0', or the sense node S0 will be pulled to a logic '0' and the reference node R0 will be pulled to a logic '1'.

The reference cells 26 may have half resistance values (that is, $R+\Delta R/2$), whereby a selected memory cell resistance less than the reference cell resistance indicates a logic '0' and a selected memory cell resistance greater than the reference cell resistance indicates a logic '1'. However, the reference cells 26 are not limited to such a resistance value.

Figure 9:
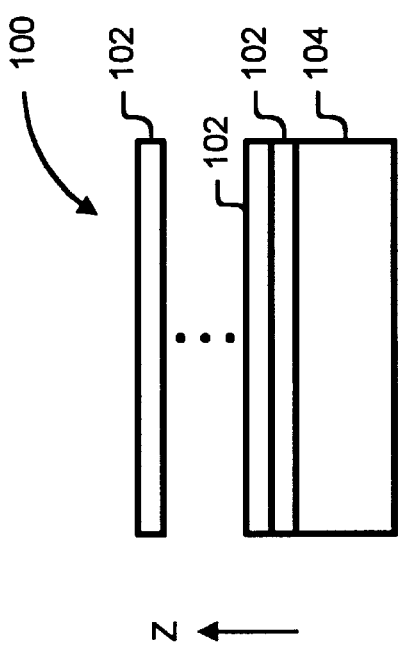
FIG. 9 is an illustration of an MRAM chip including multiple levels.

Reference is now made to FIG. 9, which illustrates a multi-level MRAM chip 100. The MRAM chip 100 includes a number Z of memory cell levels or planes 102 that are stacked in a z-direction on a substrate 104. The number Z is a positive integer where $Z \geq 1$. The memory cell levels 102 may be separated by insulating material (not shown) such as silicon dioxide. Read and write circuits may be fabricated on the substrate 104. The read and write circuits may include additional multiplexers for selecting the levels that are read from and written to.

Figure 10:
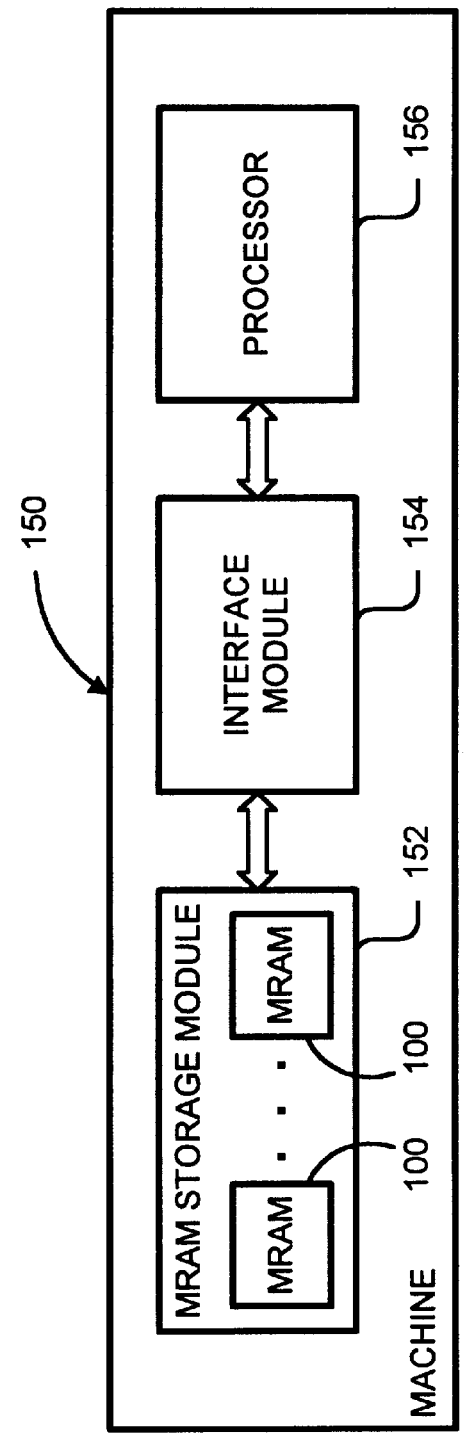
FIG. 10 is an illustration of a machine including one or more MRAM chips.

The MRAM device according to the present invention may be used in a wide variety of applications. FIG. 10 shows an exemplary general application for one or more MRAM chips 100. The general application is embodied by a machine 150 including an MRAM storage module 152, an interface module 154 and a processor 156. The MRAM storage module 152 includes one or more MRAM chips 100 for long term storage. The interface module 154 provides an interface between the processor 156 and the MRAM storage module 152. The machine 150 could also include fast volatile memory (e.g., SRAM) for short term storage.

For a machine 150 such as a notebook computer or personal computer, the MRAM storage module 152 might include a number of MRAM chips 100 and the interface module 154 might include an EIDE or SCSI interface. For a machine 150 such as a server, the MRAM storage module 152 might include a greater number of MRAM chips 100, and the interface module 154 might include a fiber channel or SCSI interface. Such MRAM storage modules 152 could replace or supplement conventional long term storage devices such as hard drives.

For a machine 150 such as a digital camera, the MRAM storage module 152 might include a smaller number of MRAM chips 100 and the interface module 154 might include a camera interface. Such an MRAM storage module 152 would allow long term storage of digital images on-board the digital camera.

The MRAM device according to the present invention offers many advantages over conventional long-term data storage devices such as hard drives. Accessing data from the MRAM devices is orders of magnitude faster than accessing data from conventional long-term storage devices such as hard drives. Additionally, MRAM devices are more compact than hard drives.

The present invention is not limited to the specific embodiments described and illustrated above. Instead, the invention is construed according to the claims that follow.

What is claimed is:

1. Apparatus for sensing a resistance state of a selected memory cell in a magnetic random access memory (MRAM) device, the apparatus comprising:
   a differential amplifier having sense and reference nodes;
   a first current mode preamplifier coupled between the selected memory cell and the sense node of the differential amplifier;
   a reference cell; and
   a second current mode preamplifier coupled between the reference cell and the reference node of the differential amplifier.

2. The apparatus of claim 1, wherein the first and second preamplifiers are direct-injection charge amplifiers.

3. The apparatus of claim 1, wherein the first and second preamplifiers are current-mirror amplifiers.

4. The apparatus of claim 1, further comprising a circuit for generating an Equalization signal, the Equalization signal being asserted to cause the sense and reference nodes of the differential amplifier to be equalized, the asserted Equalization signal also causing the differential amplifier to supply a sense current to the selected memory cell and a reference current to the reference cell, a voltage differential developing across the sense and reference nodes after the Equalization signal has been de-asserted, the differential voltage representing the resistance state of the selected memory cell.

5. The apparatus of claim 4, wherein the circuit also generates a Set signal, the Set signal being asserted after the Equalization signal has been de-asserted, the asserted Set signal causing the differential amplifier to amplify the differential voltage.

6. The apparatus of claim 5, further comprising a first switch coupling the first preamplifier to the sense node; and a second switch coupling the second preamplifier to the reference node; wherein the circuit also generates an Unload signal, the Unload signal being asserted after the Equalization signal is de-asserted but before the Set signal is asserted, the asserted Unload signal causing the first and second switches to disconnect the differential amplifier from the selected memory cell and the reference cell.

7. The apparatus of claim 6, wherein the first and second preamplifiers are first and second direct injection charge amplifiers, wherein the first switch also functions as a current source transistor for the first direct injection charge amplifier; and wherein the second switch also functions as a current source transistor for the second direct injection charge amplifier.

8. The apparatus of claim 1, wherein the differential amplifier includes a pair of cross-coupled inverters.

9. A magnetic random access memory (MRAM) device comprising:
   an array including a plurality of columns of memory cells and at least one column of reference cells;
   a plurality of bit lines, each column of memory cells being crossed by a bit line, each column of reference cells being crossed by a reference bit line; and
   a read circuit for sensing resistance states of selected memory cells in the array, the read circuit including:
      a plurality of steering circuits, each steering circuit having inputs coupled to multiple bit lines crossing the memory cell columns;
      a plurality of differential amplifiers, each differential amplifier corresponding to a steering circuit, each differential amplifier having a sense node and a reference node;
      a plurality of first current mode preamplifiers, each first current mode preamplifier being coupled between an output of a corresponding steering circuit and the sense node of a corresponding differential amplifier; and
      a plurality of second current mode preamplifiers, each second current mode preamplifier being coupled between the reference node of the corresponding differential amplifier and the reference bit line crossing a reference cell column.

10. The device of claim 9, wherein the device includes a single column of reference cells; and wherein the reference bit line crossing the single column of reference cells is connected to the reference node of each differential amplifier.

11. The device of claim 9, wherein the device includes a plurality of reference cell columns, each reference cell column corresponding to a differential amplifier; and wherein the reference bit line crossing a reference cell column is connected to the reference node of the corresponding differential amplifier.

12. The device of claim 9, wherein the device includes a plurality of reference cell columns, each reference cell column corresponding to a memory cell column; wherein the bit line crossing the memory cell column and the reference bit line crossing the corresponding reference cell column are connected to the same steering circuit.

13. The device of claim 9, wherein the first and second preamplifiers are direct-injection charge amplifiers.

14. The device of claim 9, wherein the first and second preamplifiers are current-mirror amplifiers.

15. The device of claim 9, further comprising at least one clock generator for generating an Equalization signal, the Equalization signal being asserted to cause the sense and reference nodes of the differential amplifier to be equalized, the asserted Equalization signal also causing at least one differential amplifier to pull its node voltages toward a source voltage, a voltage differential developing across the sense and reference nodes of at least one differential amplifier after the Equalization signal has been deasserted.

16. The device of claim 15, wherein each clock generator also generates a Set signal, the Set signal being asserted after the Equalization signal has been de-asserted.

17. The device of claim 16, further comprising a plurality of first and second switches, each first switch coupling a corresponding first preamplifier to the sense node of a corresponding differential amplifier, each second switch coupling a corresponding second preamplifier to the reference node of the corresponding differential amplifier; wherein each clock generator also generates an Unload signal, the Unload signal being asserted after the Equalization signal is de-asserted but before the Set signal is asserted, the asserted Unload signal causing the first and second switches to disconnect their corresponding differential amplifier from their corresponding first and second preamplifiers.

18. A method of using a differential amplifier and a reference cell to sense a resistance state of a memory cell in a magnetic random access memory (MRAM) device, the differential amplifier having sense and reference nodes, the method comprising the steps of:
   asserting an Equalization signal, the asserted equalization signal causing sense and reference node voltages to be equalized, the asserted Equalization signal also causing currents to flow through the memory and reference cells and to the sense and reference nodes;
   regulating voltages across the memory and reference cells while the currents are flowing through the cells;
   de-asserting the Equalization signal, whereby a differential voltage across the differential amplifier begins to form;
   holding the differential voltage after a period of time, the voltage being held representing the resistance state of the selected memory cell.

19. The method of claim 18, wherein the differential voltage is held by disconnecting the differential amplifier from the memory and reference cells.

20. The method of claim 18, further comprising the step of pulling each node of the differential amplifier to a full logic swing after the differential voltage has been held for the period of time.

* * * * *